US011867778B2

United States Patent
Guo et al.

(10) Patent No.: US 11,867,778 B2
(45) Date of Patent: Jan. 9, 2024

(54) SYSTEM AND METHOD FOR TESTING SPATIAL DISTRIBUTION UNIFORMITY OF ALKALI METAL ATOM NUMBER DENSITY OF ATOM MAGNETOMETER

(71) Applicant: ZHEJIANG LAB, Hangzhou (CN)

(72) Inventors: Qiang Guo, Hangzhou (CN); Ning Zhang, Hangzhou (CN); Ziwen Li, Hangzhou (CN); Zixuan Wang, Hangzhou (CN); Mengshi Zhang, Hangzhou (CN); Tingting Yu, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 38 days.

(21) Appl. No.: 17/889,802

(22) Filed: Aug. 17, 2022

(65) Prior Publication Data

US 2023/0092597 A1 Mar. 23, 2023

Related U.S. Application Data

(63) Continuation of application No. PCT/CN2022/101105, filed on Jun. 24, 2022.

(30) Foreign Application Priority Data

Sep. 14, 2021 (CN) .......................... 202111071312.8

(51) Int. Cl.
 *G01R 33/032* (2006.01)
(52) U.S. Cl.
 CPC .................................. *G01R 33/032* (2013.01)
(58) Field of Classification Search
 CPC ..... G01R 33/032; G01R 33/025; G01R 33/26
 (Continued)

(56) References Cited

U.S. PATENT DOCUMENTS

2013/0278253 A1 10/2013 Ichihara et al.
2018/0143265 A1* 5/2018 Nagasaka .............. G01R 33/34
(Continued)

FOREIGN PATENT DOCUMENTS

CN 105651649 A 6/2016
CN 107192633 A 9/2017
(Continued)

OTHER PUBLICATIONS

Fu Jiqing, Zhang Wei. "Research on the number density ratio of Cs/ 4 He in the Cs-He optical magnetometer." China Measurement and Test. vol. 44, No. 2. Feb. 28, 2018. doi: 10.11857/j.issn.1674-5124. 2018.02.001.

(Continued)

*Primary Examiner* — Christopher P McAndrew
(74) *Attorney, Agent, or Firm* — IPro, PLLC

(57) ABSTRACT

The present disclosure discloses a system and method for testing the spatial distribution uniformity of an alkali metal atom number density of an atom magnetometer. The system includes a detection laser, a laser beam expanding system, a polarizing element, a magnetic shielding system, an alkali metal atom gas chamber, a beam profile camera, a beam splitting prism, etc., which are sequentially arranged in a light advancing direction. In the method, based on an optical absorption principle, light intensity attenuations of linearly polarized light before and after passing through the alkali metal gas chamber are tested by using the beam profile camera with pixels in the level of um, a two-dimensional distribution matrix of an atom number density in space is calculated, and the distribution uniformity of the atom number density is analyzed by using a discrete coefficient.

6 Claims, 1 Drawing Sheet

(58) Field of Classification Search
USPC .................................................. 324/244.1
See application file for complete search history.

(56) References Cited

U.S. PATENT DOCUMENTS

2020/0064419 A1* 2/2020 Barry .................. G01R 33/323
2021/0041513 A1* 2/2021 Mohseni .............. G01R 33/032

FOREIGN PATENT DOCUMENTS

| CN | 108693488 A | 10/2018 |
| CN | 110146410 A | 8/2019 |
| CN | 112269155 A | 1/2021 |
| CN | 112731226 A | 4/2021 |
| CN | 113075594 A | 7/2021 |
| CN | 113777106 A | 12/2021 |

OTHER PUBLICATIONS

Yao, Han, et al. "In situ determination of alkali metal density using phase-frequency analysis on atomic magnetometers." Measurement Science and Technology 29.9 (2018): 095005.

Zhou Yinmin. "Measurement and analysis of alkali-metal-atom density distribution in gyroscopes." A Master's Dissertation. East China Normal University. Dec. 15, 2020. DOI: 10.27149/d.cnki.ghdsu.2020.001924.

* cited by examiner

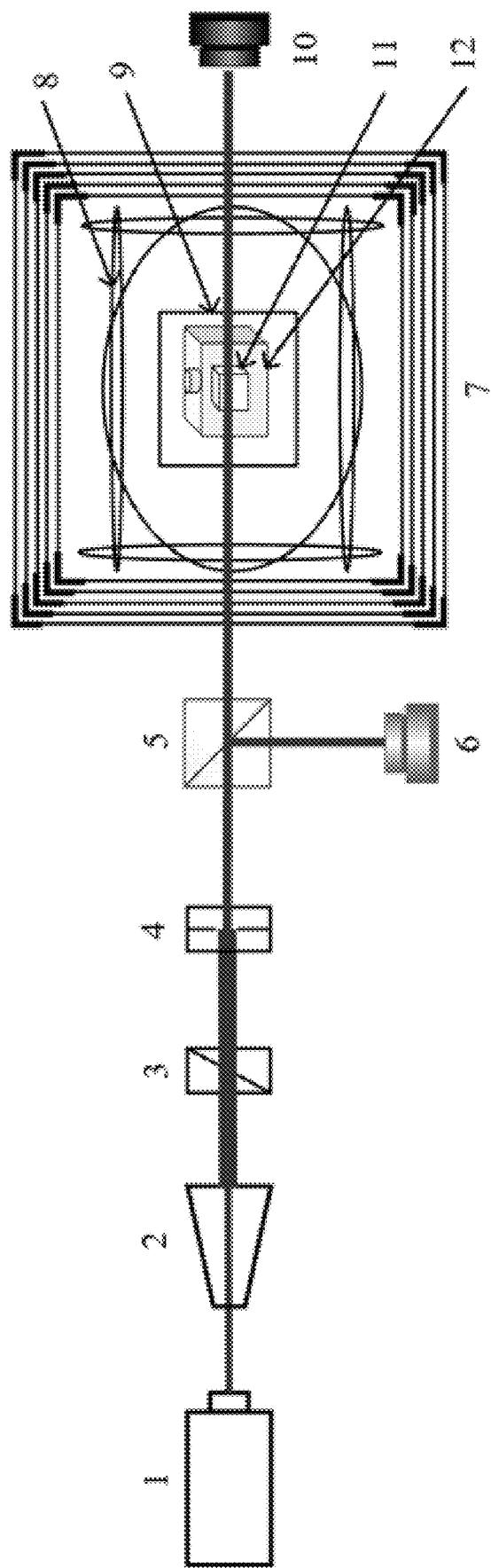

SYSTEM AND METHOD FOR TESTING SPATIAL DISTRIBUTION UNIFORMITY OF ALKALI METAL ATOM NUMBER DENSITY OF ATOM MAGNETOMETER

CROSS-REFERENCE TO RELATED APPLICATION

The present disclosure claims priority to Chinese Patent Application No. 202111071312.8 entitled "System and Method for Testing Spatial Distribution Uniformity of Alkali Metal Atom Number Density of Atom Magnetometer" filed on Sep. 14, 2021 with the Chinese Patent Office, the entire contents of which are hereby incorporated by reference.

TECHNICAL FIELD

The present disclosure belongs to the technical field of precision measurement, and particularly relates to a system and method for testing the spatial distribution uniformity of an alkali metal atom number density of an atom magnetometer.

BACKGROUND

An alkali metal atom magnetometer having a spin-exchange relaxation free effect has an extremely high magnetic field measurement sensitivity, and has been widely used in basic physics research, biomedicine, geomagnetic detection, and other fields. An alkali metal atom gas chamber is a core device of the atom magnetometer. When the gas chamber is in use, heating is required to increase the atom number density of alkali metal vapor. This is because the atom number density is directly proportional to the strength of an output signal and inversely proportional to the square of basic sensitivity. Therefore, as the atom number density is greater, the output signal is stronger, and a minimum magnetic field that can be measured is smaller. Moreover, when the atom number density is high, the collision damage between atoms is suppressed. If the temperature distribution of a heating oven is non-uniform, the atom number density will be non-uniformly distributed, and the common mode noise of gradient differential detection will be increased.

At present, common methods for testing an atom number density include a Faraday rotation effect method, a magnetic resonance line width method and a spectral absorption method. The Faraday rotation method requires a large magnetic field to be applied, whereby the magnetometer cannot operate in a spin-exchange relaxation free state. The magnetic resonance line width method requires a low atom polarizability, otherwise the magnetic resonance line width is also affected by a spin damage rate. Although the spectral absorption method is commonly used, only an overall value of the atom number density of the gas chamber can be tested, and the spatial distribution of the atom number density cannot be measured. Therefore, the uniformity cannot be analyzed.

SUMMARY

In view of the above technical problems, an object of the present disclosure is to propose a system and method for testing the spatial distribution uniformity of an alkali metal atom number density of an atom magnetometer.

The present disclosure is implemented by the following technical solution. A system for testing the spatial distribution uniformity of an alkali metal atom number density of an atom magnetometer includes: a detection light laser, a laser beam expander, a polarizer, a diaphragm, a beam splitting prism, an alkali metal atom gas chamber, and a first beam profile camera, which are sequentially arranged in a detection light advancing direction. The alkali metal atom gas chamber is sequentially coated from inside to outside with an oven, a vacuum cavity, a magnetic compensation coil, and a magnetic shielding system. A laser wavelength generated by the detection light laser is a D1/D2 line of an alkali metal atom used, and frequency requirements of an optical absorption principle are met.

After passing through the laser beam expander, the polarizer, the diaphragm, and the beam splitting prism, laser light output by the detection light laser is split into two beams of refracted light of the same power and shape by the beam splitting prism. One beam of refracted light enters a second beam profile camera to measure a light intensity distribution matrix I(0) of incident light, and the other beam of refracted light is received by the first beam profile camera after passing through the alkali metal atom gas chamber and the oven, the vacuum cavity, the magnetic compensation coil and the magnetic shielding system outside the alkali metal atom gas chamber to measure a light intensity matrix I(l) of emergent light. A matrix of an atom number density n on a pixel lattice is calculated by using the following formula:

$$n = -\ln\frac{I(l)}{I(0)} * \frac{\Gamma_L}{2r_e cfl}.$$

In the above formula: $r_e$ is a classical atom radius, c is a speed of light, f is a resonance intensity, $\Gamma_L$ is pressure broadening, and l is a travel of light in the gas chamber.

n is written in a matrix form $$n = \begin{bmatrix} n_{11} & \cdots & n_{1n} \\ \vdots & \ddots & \vdots \\ n_{n1} & \cdots & n_{nn} \end{bmatrix}.$$

The distribution uniformity of n is analyzed by using a discrete coefficient method, and a calculation formula is as follows:

$$V = \frac{\sigma}{X}$$

$\sigma$ is a variance of the matrix n, and X is an average value of all elements of the matrix n.

Preferably, the first beam profile camera has a test effective area of 11.3 mm*11.3 mm, containing a total of 2048× 2048 units each having a size of 5.5 um.

Preferably, the second beam profile camera has a test effective area of 11.3 mm*11.3 mm, containing a total of 2048×2048 units each having a size of 5.5 um.

Preferably, the alkali metal atom gas chamber is a cubic glass bubble for ensuring that optical paths are consistent at each pixel point, an alkali metal liquid is dropped into the gas chamber, and a buffer gas and a quenching gas are filled.

Preferably, the magnetic shielding system includes a five-layer permalloy magnetic shielding barrel and a three-axis Helmholtz coil.

The present disclosure also provides a method for testing the spatial distribution uniformity of an alkali metal atom number density of an atom magnetometer. Specifically, after passing through a laser beam expander, a polarizer, a diaphragm, and a beam splitting prism, laser light output by a detection light laser is split into two beams of light of the same power and shape. One beam of light enters a second beam profile camera to measure a light intensity distribution matrix I(0) of incident light, and the other beam of light is received by a first beam profile camera after passing through an alkali metal atom gas chamber and an oven, a vacuum cavity, a magnetic compensation coil and a magnetic shielding system outside the alkali metal atom gas chamber to measure a light intensity matrix I(l) of emergent light. A matrix of an atom number density n on a pixel lattice is calculated by using the following formula:

$$n = -\ln\frac{I(l)}{I(0)} * \frac{\Gamma_L}{2r_e cfl}.$$

In the above formula: $r_e$ is a classical atom radius, c is a speed of light, f is a resonance intensity, $\Gamma_L$ is pressure broadening, and l is a travel of light in the gas chamber.

n is written in a matrix form $$n = \begin{bmatrix} n_{11} & \cdots & n_{1n} \\ \vdots & \ddots & \vdots \\ n_{n1} & \cdots & n_{nn} \end{bmatrix}.$$

The distribution uniformity of n is analyzed by using a discrete coefficient method, and a calculation formula is as follows:

$$V = \frac{\sigma}{X}$$

σ is a variance of the matrix n, and X is an average value of all elements of the matrix n.

According to the present disclosure, based on the optical absorption principle, light intensity attenuations of linearly polarized light before and after passing through the alkali metal atom gas chamber are tested by using the beam profile camera with pixels in the level of um, a two-dimensional distribution of an atom number density in space is calculated, and the distribution uniformity of the atom number density is analyzed by using a discrete coefficient method. The system is simple in operation and easy to implement, may be directly implemented without changing an original optical path of the atom magnetometer, and may test the spatial distribution uniformity of the atom number density with high accuracy, thereby facilitating sensitivity analysis of the atom magnetometer, especially suppressing the common mode interference of a multi-channel differential magnetometer.

BRIEF DESCRIPTION OF FIGURES

FIG. 1 is a schematic structure diagram of a test system according to the present disclosure.

The symbols of FIG. 1 are as follows: 1—detection light laser, 2—laser beam expander, 3—polarizer, 4—diaphragm, 5—beam splitting prism, 6—second beam profile camera, 7—magnetic shielding system, 8—magnetic compensation coil, 9—vacuum cavity, 10—first beam profile camera, 11—alkali metal atom gas chamber, and 12—oven.

DETAILED DESCRIPTION

The present disclosure is further illustrated below by the drawings and specific embodiments.

As shown in FIG. 1, the present disclosure proposes a system for testing the spatial distribution uniformity of an alkali metal atom number density of an atom magnetometer, including: a detection light laser 1, a laser beam expander 2, a polarizer 3, a diaphragm 4, a beam splitting prism 5, an alkali metal atom gas chamber 11, and a first beam profile camera 10, which are sequentially arranged in a detection light advancing direction. The alkali metal atom gas chamber 11 is sequentially coated from inside to outside with an oven 12, a vacuum cavity 9, a magnetic compensation coil 8, and a magnetic shielding system 7. A laser wavelength generated by the detection light laser 1 is a D1/D2 line of an alkali metal atom used, and frequency requirements of an optical absorption principle are met. The alkali metal atom gas chamber 11 is placed inside the oven 12. The interior of the alkali metal atom gas chamber 11 is changed by controlling the temperature of the oven 12. The oven 12 is placed inside the vacuum cavity 9. The magnetic shielding system 7 ensures that the alkali metal atom gas chamber 11 is in a non-magnetic environment.

Detection light emitted by the detection light laser 1 passes through the laser beam expander 2, the polarizer 3 and the diaphragm 4. The function of the polarizer 3 is to ensure that laser light is linearly polarized light. The diaphragm 4 enables the detection light to form a circular light spot suitable for the size of the alkali metal atom gas chamber 11, and then the detection light is split into two beams of light of the same power and shape by the light splitting prism 5. One beam of light enters a beam profile camera 6 and measures a light intensity distribution matrix I(0) of light intensity of incident light on 2048*2048 units. The other beam of light is received by the beam profile camera 10 after passing through the gas chamber with the oven to measure a light intensity matrix I(l) of emergent light. A matrix of an atom number density n on a pixel lattice is calculated by using the following formula, i.e. a two-dimensional distribution of the atom number density in space, where $r_e$ is a classical atom radius, c is a speed of light, f is a resonance intensity, $\Gamma_L$ is pressure broadening, and l is a travel of light in the gas chamber, i.e. a diameter of the gas chamber.

$$n = -\ln\frac{I(l)}{I(0)} * \frac{\Gamma_L}{2r_e cfl}.$$

In the above formula: $r_e$ is a classical atom radius, c is a speed of light, f is a resonance intensity, $\Gamma_L$ is pressure broadening, and l is a travel of light in the gas chamber.

n is written in a matrix form $$n = \begin{bmatrix} n_{11} & \cdots & n_{1n} \\ \vdots & \ddots & \vdots \\ n_{n1} & \cdots & n_{nn} \end{bmatrix}.$$

The distribution uniformity of n is analyzed by using a discrete coefficient method, and a calculation formula is as follows:

$$V = \frac{\sigma}{X}$$

σ is a variance of the matrix n, and X is an average value of all elements of the matrix n.

It is obvious that the above examples of the present disclosure are merely examples for clearly illustrating the present disclosure, rather than limiting the embodiments of the present disclosure. Other changes or modifications in different forms may be made by those ordinarily skilled in the art on the basis of the above description. It is impossible to enumerate all the embodiments here. All obvious changes or modifications derived from the technical solutions of the present disclosure are still within the protection scope of the present disclosure. The content not described in detail in the description of the present disclosure belongs to the well-known technologies of those skilled in the art.

What is claimed is:

1. A system for testing the spatial distribution uniformity of an alkali metal atom number density of an atom magnetometer, comprising: a detection light laser, a laser beam expander, a polarizer, a diaphragm, a beam splitting prism, an alkali metal atom gas chamber, and a first beam profile camera, which are sequentially arranged in a detection light advancing direction, wherein the alkali metal atom gas chamber is sequentially coated from inside to outside with an oven, a vacuum cavity, a magnetic compensation coil, and a magnetic shielding system; a laser wavelength generated by the detection light laser is a D1/D2 line of an alkali metal atom used;

after passing through the laser beam expander, the polarizer, the diaphragm, and the beam splitting prism, laser light output by the detection light laser is split into two beams of refracted light of the same power and shape by the beam splitting prism, one beam of refracted light enters a second beam profile camera to measure a light intensity distribution matrix I(0) of incident light, the other beam of refracted light is received by the first beam profile camera after passing through the alkali metal atom gas chamber and the oven, the vacuum cavity, the magnetic compensation coil and the magnetic shielding system outside the alkali metal atom gas chamber to measure a light intensity matrix I(l) of emergent light, and a matrix of an atom number density n on a pixel lattice is calculated by using the following formula:

$$n = -\ln\frac{I(l)}{I(0)} * \frac{\Gamma_L}{2r_e cfl};$$

in the above formula: $r_e$ is a classical atom radius, c is a speed of light, f is a resonance intensity, $\Gamma_L$ is pressure broadening, and l is a travel of light in the gas chamber; n is written in a matrix form $$n = \begin{bmatrix} n_{11} & \cdots & n_{1n} \\ \vdots & \ddots & \vdots \\ n_{n1} & \cdots & n_{nn} \end{bmatrix};$$

the distribution uniformity of is analyzed by using a discrete coefficient method, and a calculation formula is as follows:

$$V = \frac{\sigma}{X}$$

σ is a variance of the matrix n, and X is an average value of all elements of the matrix n.

2. The system for testing the spatial distribution uniformity of an alkali metal atom number density of an atom magnetometer according to claim 1, wherein the first beam profile camera has a test effective area of 11.3 mm*11.3 mm, containing a total of 2048×2048 units each having a size of 5.5 um.

3. The system for testing the spatial distribution uniformity of an alkali metal atom number density of an atom magnetometer according to claim 1, wherein the second beam profile camera has a test effective area of 11.3 mm*11.3 mm, containing a total of 2048×2048 units each having a size of 5.5 um.

4. The system for testing the spatial distribution uniformity of an alkali metal atom number density of an atom magnetometer according to claim 1, wherein the alkali metal atom gas chamber is a cubic glass bubble for ensuring that optical paths are consistent at each pixel point, an alkali metal liquid is dropped into the gas chamber, and a buffer gas and a quenching gas are filled.

5. The system for testing the spatial distribution uniformity of an alkali metal atom number density of an atom magnetometer according to claim 1, wherein the magnetic shielding system comprises a five-layer permalloy magnetic shielding barrel and a three-axis Helmholtz coil.

6. A method for testing the spatial distribution uniformity of an alkali metal atom number density of an atom magnetometer, wherein after passing through a laser beam expander, a polarizer, a diaphragm, and a beam splitting prism, laser light output by a detection light laser is split into two beams of light of the same power and shape, one beam of light enters a second beam profile camera to measure a light intensity distribution matrix I(0) of incident light, the other beam of light is received by a first beam profile camera after passing through an alkali metal atom gas chamber and an oven, a vacuum cavity, a magnetic compensation coil and a magnetic shielding system outside the alkali metal atom gas chamber to measure a light intensity matrix I(l) of emergent light, and a matrix of an atom number density n on a pixel lattice is calculated by using the following formula:

$$n = -\ln\frac{I(l)}{I(0)} * \frac{\Gamma_L}{2r_e cfl};$$

in the above formula: $r_e$ is a classical atom radius, c is a speed of light, f is a resonance intensity, $\Gamma_L$ is pressure broadening, and l is a travel of light in the gas chamber; n is written in a matrix form $$n = \begin{bmatrix} n_{11} & \cdots & n_{1n} \\ \vdots & \ddots & \vdots \\ n_{n1} & \cdots & n_{nn} \end{bmatrix};$$

the distribution uniformity of n is analyzed by using a discrete coefficient method, and a calculation formula is as follows:

$$V = \frac{\sigma}{X}$$

σ is a variance of the matrix n, and X is an average value of all elements of the matrix n.

\* \* \* \* \*